United States Patent
Tsukamoto et al.

(10) Patent No.: US 10,006,117 B2
(45) Date of Patent: Jun. 26, 2018

(54) SPUTTERING TARGET-BACKING PLATE ASSEMBLY AND METHOD FOR PRODUCING SAME

(75) Inventors: Shiro Tsukamoto, Ibaraki (JP); Kazumasa Ohashi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 728 days.

(21) Appl. No.: 13/881,510

(22) PCT Filed: Oct. 25, 2011

(86) PCT No.: PCT/JP2011/074487
§ 371 (c)(1),
(2), (4) Date: May 16, 2013

(87) PCT Pub. No.: WO2012/057106
PCT Pub. Date: May 3, 2012

(65) Prior Publication Data
US 2013/0220805 A1    Aug. 29, 2013

(30) Foreign Application Priority Data

Oct. 27, 2010   (JP) ................................. 2010-241051

(51) Int. Cl.
C23C 14/34 (2006.01)
H01J 37/34 (2006.01)
B23K 1/20 (2006.01)

(52) U.S. Cl.
CPC ............... *C23C 14/34* (2013.01); *B23K 1/20* (2013.01); *C23C 14/3407* (2013.01); *H01J 37/3426* (2013.01); *H01J 37/3435* (2013.01)

(58) Field of Classification Search
CPC ....... B23K 1/20; C23C 14/34; C23C 14/3407; C23C 14/3414; H01J 37/3426; H01J 37/3435
USPC ........ 204/298.12, 298.13; 228/193, 194, 195
See application file for complete search history.

(56) References Cited

U.S. PATENT DOCUMENTS

| | | | |
|---|---|---|---|
| 5,693,203 A | 12/1997 | Ohhashi et al. | |
| 6,759,143 B2 | 7/2004 | Oda et al. | |
| 6,793,124 B1 | 9/2004 | Takahashi et al. | |
| 6,858,116 B2 | 2/2005 | Okabe et al. | |
| 7,115,193 B2 | 10/2006 | Takahashi | |
| 7,347,353 B2 | 3/2008 | Yamakoshi et al. | |
| 8,157,973 B2 | 4/2012 | Oda et al. | |
| 2007/0051624 A1 | 3/2007 | Okabe et al. | |
| 2007/0125646 A1 | 6/2007 | Young et al. | |
| 2007/0170052 A1 | 7/2007 | Ritchie et al. | |
| 2007/0173059 A1 | 7/2007 | Young et al. | |
| 2008/0116066 A1 | 5/2008 | Miyashita | |
| 2009/0008245 A1 | 1/2009 | Yamakoshi et al. | |
| 2010/0206724 A1 | 8/2010 | Takahashi | |
| 2012/0228132 A1 | 9/2012 | Koido | |
| 2012/0318669 A1 | 12/2012 | Ikeda et al. | |

FOREIGN PATENT DOCUMENTS

| | | | |
|---|---|---|---|
| JP | 55-152109 A | | 11/1980 |
| JP | 04-048072 | * | 2/1992 |
| JP | 04-131374 A | | 5/1992 |
| JP | 06-025839 A | | 2/1994 |
| JP | 08-188872 A | | 7/1996 |
| JP | 08-067978 A | | 12/1996 |
| JP | 11-189870 A | | 7/1999 |
| JP | 2000-239838 A | | 9/2000 |
| JP | 2000-345330 A | | 12/2000 |
| JP | 2001-295040 A | | 10/2001 |
| JP | 2006-033603 A | | 2/2006 |
| JP | 2009-191324 A | | 8/2009 |

OTHER PUBLICATIONS

H. Nakajima et al., "Diffusioin in Titanium", ISIJ International, vol. 31, No. 8, pp. 757-766, 1991 (month unknown).

* cited by examiner

*Primary Examiner* — Rodney G McDonald
(74) *Attorney, Agent, or Firm* — Howson & Howson LLP

(57) ABSTRACT

Provided is a sputtering target-backing plate assembly wherein a Cu—Cr alloy backing plate is bonded to a Ti target via a layer of a strain absorbing material placed at an interface between the Ti target and the Cu—Cr alloy backing plate. In particular, the present invention relates to a sputtering target-backing plate assembly and a production method thereof, the assembly being capable of absorbing strain at the interface between the target and the backing plate in order to prevent deformation (displacement) during sputtering. An object of the present invention is to solve a problem inherent to Titanium (Ti) and a problem in selecting a backing plate compatible with it.

9 Claims, No Drawings

SPUTTERING TARGET-BACKING PLATE ASSEMBLY AND METHOD FOR PRODUCING SAME

BACKGROUND

The present invention relates to a sputtering target-backing plate assembly used when titanium (Ti) is a sputtering target material, and in particular relates to a sputtering target-backing plate assembly capable of absorbing strain at an interface between the target and the backing plate in order to prevent deformation (displacement) during sputtering. The present invention also relates to a production method thereof.

In recent years, a sputtering target of titanium (Ti) has been needed for MRAM. A target is usually bonded to a backing plate and sputtering is performed at high power in order to increase production efficiency. Issues when performing this high power sputtering are hardness and cooling capacity of the backing plate itself, and the bonding strength between the backing plate and the target.

As conventional technologies, several ideas have been proposed for increasing bonding strength between a target and a backing plate. These are described briefly in the following. For example, there is a technology in which Ag or an Ag alloy is inserted as an insert material to perform solid phase diffusion for bonding a target material of Al or an Al alloy to a backing plate (see Patent Document 1).

There is another technology in which concentric unevenness is formed at a bonding surface between a sputtering target and a backing plate, and bonding is performed by the HIP, hot press, or solid phase diffusion bonding method while they remain fitted with each other (see Patent Document 2).

There is also a technology in which a target material having a melting point of 1000° C. or higher is bonded to a backing plate by solid phase diffusion via an insert material (Al, Cu, Ni and alloys thereof) having a melting point lower than that of the target (see Patent Document 3).

There is also a technology in which bonding is performed at low temperature via fine grains of copper placed between a sputtering target and a backing plate (see Patent Document 4).

Furthermore, there is a technology in which bonding is performed by explosion bonding or hot rolling via a spacer of Al or an Al alloy placed between a sputtering target and a backing plate (see Patent Document 5). Moreover, a sputtering device has been disclosed in which unevenness is provided at a cooling surface of a backing plate to increase its surface area (see Patent Document 6).

In addition, Patent Document 7 describes a technology in which diffusion bonding is performed via an insert material of an aluminum or aluminum alloy plate having a thickness of 0.8 mm or more for a tantalum or tungsten-copper alloy backing plate assembly.

Further, Patent Document 8 describes a technology in which diffusion bonding is performed via an insert material of an aluminum or aluminum alloy plate having a thickness of 0.8 mm or more for a diffusion bonded assembly of high-purity cobalt and a copper alloy backing plate.

Still further, Patent Document 9 describes a sputtering target in which backing plate material 4 having plural metal layers 2, 3, and target material 5 are bonded together by diffusion bonding or welding.

Yet further, Patent Document 10 describes that, when solid-phase diffusion bonding is performed to a target and a backing plate via an insert material, one or both sides are subject to a planarization process to give a roughness Ra 0.01 to 3.0 μm.

Even yet further, Patent Document 11 describes a bonding method in which when a target and a backing plate are bonded, elastomer resin having metal mesh therein is used.

Furthermore, Patent Document 12 describes that copper, aluminum or an alloy foil thereof is sandwiched between a target and a backing plate to perform sputtering.

These Patent Documents describe devised bonding methods for increasing the bonding strength between a sputtering target and a backing plate. However, neither a problem nor means for solving the problem has been disclosed at all, the problem being with regard to the amount of strain resulting from materials of the backing plate and the target, in particular, strain generation when using titanium as a target and a Cu—Cr alloy as a backing plate.

Patent Document 1: Japanese Patent Laid-Open No. H6-172993
Patent Document 2: Japanese Patent No. 4017198
Patent Document 3: Japanese Patent Laid-Open No. H6-108246
Patent Document 4: Japanese Patent Laid-Open No. S55-152109
Patent Document 5: Japanese Patent Laid-Open No. H4-131374
Patent Document 6: Japanese Patent Laid-Open No. H6-25839
Patent Document 7: Japanese Patent No. 3905301
Patent Document 8: Japanese Patent No. 3905295
Patent Document 9: Japanese Patent Laid-Open No. 2001-295040
Patent Document 10: Japanese Patent Laid-Open No. 2000-239838
Patent Document 11: Japanese Patent Laid-Open No. 2006-33603
Patent Document 12: Japanese Patent Laid-Open No. H11-189870

SUMMARY OF INVENTION

Technical Problem

The present invention provides a sputtering target-backing plate assembly used when titanium (Ti) is a sputtering target material. In particular an object of the present invention is to enhance the bonding strength between a target material and a backing plate in order to increase sputtering efficiency, solving a problem inherent to titanium (Ti) and a problem in selecting a backing plate compatible with it.

Solution to Problem

The inventions as described below provide a solution for the problems described above.
1) A sputtering target-backing plate assembly, wherein a Cu—Cr alloy backing plate is bonded to a Ti target via a layer of a strain absorbing material placed at an interface between the Ti target and the Cu—Cr alloy backing plate.
2) The sputtering target-backing plate assembly according to 1) above, wherein a difference between a maximum value of displacement from a flat when turning sputtering ON and a maximum value of displacement from a flat when turning sputtering OFF is 1 mm or less.
3) The sputtering target-backing plate assembly according to 1) or 2) above, wherein adhesive strength of a bonded interface of the target-backing plate assembly is 3 kgf/mm² or more.

4) The sputtering target-backing plate assembly according to any one of 1) to 3) above, wherein the strain absorbing material is Ni, Zn, Ag, Cu, Al, Cr, Sn or an alloy primarily containing thereof.
5) The sputtering target-backing plate assembly according to any one of 1) to 4) above, wherein the layer of the strain absorbing material has a thickness of 1 mm or more and 6 mm or less.
6) The sputtering target-backing plate assembly according to any one of 1) to 5) above, wherein a surface of the Cu—Cr alloy backing plate is roughened with a lathe in advance before bonding.
7) The sputtering target-backing plate assembly according to any one of 1) to 9) above, wherein the Ti target comprises high purity Ti of 4N5 or more.
8) A method for producing a sputtering target-backing plate assembly in which a Ti target and a Cu—Cr alloy backing plate are bonded, the method comprising: placing a layer of Al or an alloy primarily containing Al, which has a thickness of 1 mm or more and 6 mm or less, at an interface between the target material and the backing plate; and performing bonding at a temperature between 400 and 550° C.
9) The method for producing a sputtering target-backing plate assembly according to 11) above, the method achieving the adhesive strength of 3 kgf/mm$^2$ or more without allowing diffusion at the bonded interface of the target backing plate assembly.

According to the present invention, when producing a sputtering target-backing plate assembly in which a target material of Ti is bonded to a backing plate of a Cu—Cr alloy, bonding is performed via a layer of a strain absorbing material placed at the interface between the target material and the backing plate. This leads to absorption of strain at the interface between the target and the backing plate, and suppression of deformation of the target during sputtering, thereby allowing uniform deposition, a reduced defect rate and increased production efficiency even by high power sputtering. These are significantly advantageous effects of the present invention.

DETAILED DESCRIPTION

The sputtering methods already known include: a coating method, in which voltage is applied to both the target side as a cathode and the substrate side as an anode in a sputtering device filled with Ar gas to eject a target material by the collision of Ar ions with the target, and a substrate is coated with the ejected material; and a coating method of so-called self sputtering, in which atoms sputtered from a target are ionized to self-sustain sputtering.

In many cases, a sputtering target is bonded to a backing plate, and the backing plate is cooled to prevent abnormal increase in temperature at the target, allowing stable sputtering.

In such a sputtering device, sputtering power tends to be raised to increase production efficiency to allow high speed sputtering. Similar materials are not usually used for a backing plate and a sputtering target. Usually, a material having good heat conductivity and having certain strength is used for a backing plate.

Further, in a sputtering device, a backing plate is cooled to absorb thermal shock applied to a target through this backing plate. However, the cooling has limitation. In particular, a problem is detachment or deformation of a target due to different thermal expansion between a target and a backing plate.

Furthermore, a target is subject to erosion, resulting in unevenness. When performing high power sputtering, a phenomenon where thermal stress produced by heat during sputtering concentrates mainly at concave regions, resulting in deformation of a target and reduced uniformity; or a phenomenon where arcing to a shield causes abnormal particles, resulting in stopping generation of plasma at an extreme case, may occur.

In order to solve these problems, some counter measures can be conceived such as increasing strength of a backing plate or altering materials to reduce thermal stress. However, appropriate solutions have not been found because compatibility with Ti, which is a material of a target, is not satisfactory.

The sputtering target-backing plate assembly of the present invention is a sputtering target-backing plate assembly in which a target material of Ti is bonded to a backing plate of a Cu—Cr alloy via a layer of Al or an alloy primarily containing Al (an insert) placed at the interface between the target material and the backing plate. For a Cu—Cr alloy used for a backing plate, an alloy containing Cr in amount of 0.7 to 1.2 wt % is used. This Cu—Cr alloy is a material having high strength and good thermal conductivity.

Examples and Comparative Examples are shown below. Al or an alloy primarily containing Al used for bonding Ti and a Cu—Cr alloy shows significantly advantageous effects as follows: it absorbs deformation of a target and prevents detachment during processing, or sputtering with, the assembly in which the target and the backing plate are bonded. It is understood that this is an inherited problem in the case that a target material is Ti and a backing plate is a Cu—Cr alloy. The Al layer or the alloy layer primarily containing Al did not show any appreciable evidence of diffusion of constituent elements thereof into both the target and the backing plate, and no defect was observed in the bonded interfaces of the Al layer or the Al alloy layer to both the target and the backing plate. This is necessary in order to suppress deformation and to increase bonding strength.

In the sputtering target-backing plate assembly, the adhesive strength of the bonded interface of 3 kgf/mm$^2$ or more can be achieved. The present invention can provide a sputtering target-backing plate assembly as described above. Alternatives to an Al layer or an Al alloy layer include layers of Ni, Zn, Ag, Cu, Cr, Sn or an alloy primarily containing thereof. Although an Al layer, a Ni layer or an Ag layer is described in Examples, it has been observed that similar effects can also be obtained by a layer of: an alloy primarily containing Al, Ni or Ag; Zn; Cu; Cr; Sn; or an alloy primarily containing Zn, Cu, Cr or Sn.

In order to form a layer of Al or an alloy primarily containing Al, as the most efficient technique, a plate of Al or an alloy primarily containing Al is placed, and bonding is performed at 400 to 550° C. at a pressing pressure of 1450 kg/cm$^2$. However, as long as Al or an Al alloy having a predetermined thickness can be placed between a Ti target and a Cu—Cr alloy backing plate, other means for formation may be used. For example, it will be easily understood that the physical vapor deposition methods such as the sputtering method, the chemical deposition methods and the plating methods may be used.

In recent years, high purity Ti of 4N5 or more, which is required for a target material of Ti, is the most suitable for the Ti sputtering target-backing plate assembly. Further, in a preferred method, a layer of Al or an alloy primarily containing Al is formed at a surface of a Ti target material in contact with a backing plate in order to coat the target uniformly and reliably. However, the backing plate or both of them can be coated.

The layer of Al or an alloy primarily containing Al preferably has a thickness of 1 mm or more and 6 mm or less. As determined by many experiments, a large amount of coating is not preferred because heat transfer to a backing plate may be blocked. Also, a large amount of coating is not preferred in view of production efficiency. Further, if the thickness is too small, good strain absorbing effects and sufficient bonding strength can not be obtained.

According to the present invention, bonding strength can be further enhanced by roughening a surface of a Cu—Cr alloy backing plate with a lathe in advance before bonding.

For the layer of Al or an alloy primarily containing Al, Al can be used as shown in the following Examples. For an alloy primarily containing Al, for example, an Al alloy containing Al: 50 wt % or more can be used, and more specifically an Al alloy containing Cr: 20 wt % and the reminder Al can be used.

EXAMPLES

The present invention will be described with reference to Examples and Comparative Examples. Note that Examples below are intended merely as examples, and the present invention is not limited only to these Examples. That is, other aspects or modifications included in the present invention are to be encompassed.

Example 1

Example 1 is described below. For a test piece, high purity titanium of 4N5 (99.995 wt % except for gas components) was used as a target material (0.45 inches thick, 15.654 inches ϕ). For a backing plate, the above Cu—Cr alloy (0.5 inches thick, 15.654 inches ϕ) was used.

Then a 2 mm thick aluminum (Al) plate (an insert) intervened at the bonded interface between the Ti target and the backing plate to give a test piece. The surfaces of the target and the backing plate were washed, and then enclosed within a vacuum vessel to perform HIP at 300° C. at a pressure of 1450 kg/cm² with a holding time of 1 hour.

After the target was bonded to the backing plate via the Al plate (an Al insert material) placed at the interface, ultrasonic inspection was performed from the target side to inspect an internal defect. In this ultrasonic inspection, no defects were observed at all at the interface between the target and the backing plate.

That is, when Al was coated to the interface between the Ti target and the Cu—Cr alloy backing plate, detachment at the interface did not occur at all during the processing step of cutting and machining this sputtering target-backing plate assembly.

Next, one sample at the central region, two samples at the ½ R region, and two samples at the peripheral region were taken from this sputtering target-backing plate assembly to make tensile test pieces. Tensile tests were performed using these samples.

The results from the tensile tests showed that the adhesive strength was in the range between 3 and 6 kg/mm², indicating that good adhesive strength was obtained. For all the regions sampled, the bonding strength of 3 kgf/mm² or more, which is a suitable condition for the present invention, was achieved.

In Example 1, a thickness of the Al coating layer at the interface was intended to be 2 mm. However, any Al layers having a thickness of 1 mm or more and 6 mm or less were able to produce suitable adhesive strength.

Next, the sputtering target-backing plate assembly of this Example, in which a target and a backing plate were bonded via an Al plate (an Al insert material) placed at the interface, was placed in a sputtering device to perform various measurements. The results from the measurements are shown in Table 1.

This sputtering target-backing plate assembly was placed in a sputtering device (the periphery of the backing plate was fixed), and cooling water was flowed on the rear of the backing plate while applying water pressure.

Then, at 38 kWh, sputtering was performed for 33 seconds (Sputtering ON), and then sputtering was stopped for 74 seconds (Sputtering OFF). This procedure was repeated 15 times, during which cooling was continued. After the procedure was repeated 15 times, the bulge at the central region (the amount of displacement) of the sputtering target-backing plate assembly became constant. Note that the amount of displacement in this case corresponds to an amount of displacement from the state when the sputtering target-backing plate assembly was just mounted in the sputtering device; i.e. from the flat state.

A maximum value of displacement from the flat state when Sputtering OFF was 3.066 mm. On the other hand, a maximum value of displacement from the flat state when Sputtering ON was 3.379 mm. Each of these is a mean value measured by repeating ON and OFF for 15 times as described above. The difference between these maximum values was 0.313 mm, which was very small. Note that the maximum value of displacement for the case of prolonged Sputtering OFF was 3.307 mm. This is shown in Table 1 just for reference.

The observation that very small difference can be achieved between the maximum values due to repeating ON and OFF means that deformation of the target is suppressed by absorption of strain at the interface between the target and the backing plate during sputtering. This provides significantly advantageous effects; uniform deposition is possible even by high power sputtering to reduce a defect rate and to increase production efficiency.

Thereafter (after sputtering), water cooling was stopped and a water pressure was removed. The maximum value of displacement from the flat was 0.1458 mm at the time. And, the maximum value of displacement from the flat state was −0.04945 mm when the fixation screws for the target were removed (a negative value means reversed bending; i.e., a phenomenon of slightly denting at the center).

A temperature when Sputtering OFF was 91.42° C., and a temperature when Sputtering ON was 407.9° C. Accordingly, the difference between the temperatures when Sputtering OFF and ON was 316.5° C.

With regard to Example 1, an aluminum plate having a thickness of 2 mm was used for an aluminum insert material, but any aluminum plates having a thickness of 1 mm or more and 6 mm or less were able to produce similar effects as in Example 1.

TABLE 1

| Conditions | (1) Max. value of displacement from the flat when Sputtering OFF (mm) | (2) Max. value of displacement from the flat when Sputtering ON (mm) | (3) (2) − (1) (mm) | (4) Max value of displacement from the flat when OFF for a long time (mm) | (5) Max. value of displacement from the flat when cooling water and a water pressure was removed (mm) | (6) Max. value of displacement from the flat when fixation screws of the target were removed (mm) | (7) Temperature when Sputtering OFF (° C.) | (8) Temperature when Sputtering ON (° C.) | (9) (8) − (7) (° C.) |
|---|---|---|---|---|---|---|---|---|---|
| Example 1 (Al) | 3.066 | 3.379 | 0.313 | 3.307 | 0.1458 | −0.04945 | 91.42 | 407.9 | 316.5 |
| Example 2 (Ni) | 3.073 | 3.387 | 0.314 | 3.315 | 0.1467 | −0.04987 | 90.92 | 408.5 | 316.5 |
| Example 3 (Ag) | 3.059 | 3.372 | 0.313 | 3.299 | 0.1451 | −0.4921 | 91.13 | 407.1 | 316.0 |
| Comparative Example 1 | 0.9565 | 2.676 | 1.7195 | 0.3491 | 0.04566 | −0.04628 | 90.87 | 406.4 | 315.5 |
| Comparative Example 2 (Ta) | 0.8946 | 2.571 | 1.6764 | 0.2982 | 0.04161 | −0.04584 | 90.99 | 406.7 | 315.7 |

Example 2

Next, Example 2 is described. For a test piece, high purity titanium of 4N5 (99.995 wt % except for gas components) was used as a target material (0.45 inches thick, 15.654 inches φ). For a backing plate, the above Cu—Cr alloy (0.5 inches thick, 15.654 inches φ) was used.

Then a 2 mm thick nickel (Ni) plate (an insert) intervened at the bonded interface between the Ti target and the backing plate to give a test piece. The surfaces of the target and the backing plate were washed, and then enclosed within a vacuum vessel to perform HIP at 300° C. at a pressure of 1450 kg/cm$^2$ with a holding time of 1 hour.

After the target was bonded to the backing plate via the Ni plate (a Ni insert material) placed at the interface, ultrasonic inspection was performed from the target side to inspect an internal defect. In this ultrasonic inspection, no defects were observed at all at the interface between the target and the backing plate.

That is, when Ni was coated at the interface between the Ti target and the Cu—Cr alloy backing plate, detachment at the interface did not occur at all during the processing step of cutting and machining this sputtering target-backing plate assembly.

Next, one sample at the central region, two samples at the ½ R region, and two samples at the peripheral region were taken from this sputtering target-backing plate assembly to make tensile test pieces. Tensile tests were performed using these samples.

The results from the tensile tests showed that the adhesive strength was in the range between 3 and 5 kg/mm$^2$, indicating that good adhesive strength was obtained. For all the regions sampled, the bonding strength of 3 kgf/mm$^2$ or more, which is a suitable condition for the present invention, was achieved.

In Example 2, a thickness of the Ni coating layer at the interface was intended to be 2 mm. However, any Ni layers having a thickness of 1 mm or more and 6 mm or less were able to produce suitable adhesive strength.

Next, the sputtering target-backing plate assembly of this Example, in which a target and a backing plate were bonded via a Ni plate (a Ni insert material) placed at the interface, was placed in a sputtering device to perform various measurements. The results from the measurements are shown in Table 1.

This sputtering target-backing plate assembly was placed in a sputtering device (the periphery of the backing plate was fixed), and cooling water was flowed on the rear of the backing plate while applying water pressure.

Then, at 38 kWh, sputtering was performed for 33 seconds (Sputtering ON), and then sputtering was stopped for 74 seconds (Sputtering OFF). Then this procedure was repeated 15 times, during which cooling was continued. After the procedure was repeated 15 times, the bulge at the central region (the amount of displacement) of the sputtering target-backing plate assembly became constant. Note that the amount of displacement in this case corresponds to an amount of displacement from the state when the sputtering target-backing plate assembly was just mounted in the sputtering device; i.e. from the flat state.

The maximum value of displacement from the flat state when Sputtering OFF was 3.073 mm. On the other hand, the maximum value of displacement from the flat state when Sputtering ON was 3.387 mm. Each of these is a mean value measured by repeating ON and OFF for 15 times as described above. The difference between these maximum values was 0.314 mm, which was very small. Note that the maximum value of displacement for the case of prolonged Sputtering OFF was 3.315 mm. This is shown in Table 1 just for reference.

The observation that very small difference can be achieved between the maximum values due to repeating ON and OFF means that deformation of the target is suppressed by absorption of strain at the interface between the target and the backing plate during sputtering. This provides significantly advantageous effects; uniform deposition is possible even by high power sputtering to reduce a defect rate and to increase production efficiency.

Thereafter (after sputtering), water cooling was stopped and a water pressure was removed. The maximum value of displacement from the flat was 0.1467 mm at the time. And, the maximum value of displacement from the flat state was −0.04987 mm when the fixation screws for the target were removed (a negative value means reversed bending; i.e., a phenomenon of slightly denting at the center).

A temperature when Sputtering OFF was 90.92° C., and a temperature when Sputtering ON was 408.50° C. Accordingly, the difference between the temperatures when Sputtering OFF and ON was 316.5° C.

With regard to Example 2 above, a nickel plate having a thickness of 2 mm was used for a nickel insert material, but any nickel plates having a thickness of 1 mm or more and 6 mm or less were able to produce similar effects as in Example 2.

Example 3

Next, Example 3 is described. For a test piece, high purity titanium of 4N5 (99.995 wt % except for gas components) was used as a target material (0.45 inches thick, 15.654 inches φ). For a backing plate, the above Cu—Cr alloy (0.5 inches thick, 15.654 inches φ) was used.

Then a 2 mm thick silver (Ag) plate (an insert) intervened at the bonded interface between the Ti target and the backing plate to give a test piece. The surfaces of the target and the backing plate were washed, and then enclosed within a vacuum vessel to perform HIP at 300° C. at a pressure of 1450 kg/cm$^2$ with a holding time of 1 hour.

After the target was bonded to the backing plate via the Ag plate (an Ag insert material) placed at the interface, ultrasonic inspection was performed from target the side to inspect an internal defect. In this ultrasonic inspection, no defects were observed at all at the interface between the target and the backing plate.

That is, when Ag was coated at the interface between the Ti target and the Cu—Cr alloy backing plate, detachment at the interface did not occur at all during the processing step of cutting and machining this sputtering target-backing plate assembly.

Next, one sample at the central region, two samples at the ½ R region, and two samples at the peripheral region were taken from this sputtering target-backing plate assembly to make tensile test pieces. Tensile tests were performed using these samples. The results from the tensile tests showed that the adhesive strength was in the range between 7 and 10 kg/mm$^2$, indicating that good adhesive strength was obtained. For all the regions sampled, the bonding strength of 3 kgf/mm$^2$ or more, which is a suitable condition for the present invention, was achieved. In Example 3, a thickness of the Ag coating layer at the interface was intended to be 2 mm. However, any Ag layers having a thickness of 1 mm or more and 6 mm or less were able to produce suitable adhesive strength.

Next, the sputtering target-backing plate assembly of this Example, in which a target and a backing plate were bonded via an Ag plate (an Ag insert material) placed at the interface, was placed in a sputtering device to perform various measurements. The results from the measurements are shown in Table 1.

This sputtering target-backing plate assembly was placed in a sputtering device (the periphery of the backing plate was fixed), and cooling water was flowed on the rear of the backing plate while applying water pressure.

Then, at 38 kWh, sputtering was performed for 33 seconds (Sputtering ON), and then sputtering was stopped for 74 seconds (Sputtering OFF). Then this procedure was repeated 15 times, during which cooling was continued. After the procedure was repeated 15 times, the bulge at the central region (the amount of displacement) of the sputtering target-backing plate assembly became constant. Note that the amount of displacement in this case corresponds to an amount of displacement from the state when the sputtering target-backing plate assembly was just mounted in the sputtering device; i.e. from the flat state.

The maximum value of displacement from the flat state when Sputtering OFF was 3.059 mm. On the other hand, the maximum value of displacement from the flat state when Sputtering ON was 3.372 mm. Each of these is a mean value measured by repeating ON and OFF for 15 times as described above. The difference between these maximum values was 0.313 mm, which was very small. Note that the maximum value of displacement for the case of prolonged Sputtering OFF was 3.299 mm. This is shown in Table 1 just for reference.

The observation that very small difference can be achieved between the maximum values due to repeating ON and OFF means that deformation of the target is suppressed by absorption of strain at the interface between the target and the backing plate during sputtering. This provides significantly advantageous effects; uniform deposition is possible even by high power sputtering to reduce a defect rate and to increase production efficiency.

Thereafter (after sputtering), water cooling was stopped and a water pressure was removed. The maximum value of displacement from the flat was 0.1451 mm at the time. And, the maximum value of displacement from the flat state was −0.04921 mm when the fixation screws for the target were removed (a negative value means reversed bending; i.e., a phenomenon of slightly denting at the center).

A temperature when Sputtering OFF was 91.13° C., and a temperature when Sputtering ON was 407.1° C. Accordingly, the difference between the temperatures when Sputtering OFF and ON was 316.0° C.

With regard to Example 3 above, a silver plate having a thickness of 2 mm was used for a silver insert material, but any silver plates having a thickness of 1 mm or more and 6 mm or less were able to produce similar effects as in Example 2.

Comparative Example 1

Next, Comparative Example 1 is described. For a test piece, high purity titanium of 4N5 (99.995 wt % except for gas components) was used as a target material (0.45 inches thick, 15.654 inches φ). For a backing plate, the above Cu—Cr alloy (0.5 inches thick, 15.654 inches φ) was used. However, an insert was not placed at the interface between the Ti target and the backing plate. This was used as a test piece.

The surfaces of the target and the backing plate were washed, and then enclosed within a vacuum vessel to perform HIP at a temperature of 300° C. at a pressure of 1450 kg/cm$^2$ with a holding time of 1 hour.

After the target was bonded to the backing plate without an Al plate (an Al insert material), ultrasonic inspection was performed from the target side to inspect an internal defect. In this ultrasonic inspection, defects were observed at the interface between the target and the backing plate.

Next, one sample at the central region, two samples at the ½ R region, and two samples at the peripheral region were taken from this sputtering target-backing plate assembly to make tensile test pieces. Tensile tests were performed using these samples.

The results from the tensile tests showed that the adhesive strength was in the range between 1 and 2 kg/mm$^2$, indicating that the adhesive strength was poor. For any of the sampled regions, the bonding strength of 3 kgf/mm$^2$ or more, which is a suitable condition for the present invention, was not achieved.

Next, the sputtering target-backing plate assembly of this Comparative Example was placed in a sputtering device to perform various measurements as in Example 1.

The results from the measurements are shown in Table 1. This sputtering target-backing plate assembly was placed in a sputtering device (the periphery of the backing plate was fixed), and cooling water was flowed on the rear of the backing plate while applying water pressure.

Then, at 38 kWh, sputtering was performed for 33 seconds (Sputtering ON), and then sputtering was stopped for 74 seconds (Sputtering OFF). Then this procedure was repeated 15 times, during which cooling was continued. After the procedure was repeated 15 times, the bulge at the central region (the amount of displacement) of the sputtering target-backing plate assembly became constant.

Note that the amount of displacement in this case corresponds to an amount of displacement from the state when the sputtering target-backing plate assembly was just mounted in the sputtering device; i.e. from the flat state.

The maximum value of displacement from the flat state when Sputtering OFF was 0.9565 mm as described above. On the other hand, the maximum value of displacement from the flat state when Sputtering ON was 2.676 mm.

Each of these is a mean value measured by repeating ON and OFF for 15 times as described above. Accordingly, the difference between these maximum values was 1.7195 mm, indicating that the difference was increased by 5 to 6 times compared with those in Examples.

However, a large difference in an amount of displacement between sputtering OFF and ON is not preferred. This is because a large difference between the maximum values due to repeating ON and OFF means that strain at the interface between the target and the backing plate during sputtering can not be absorbed and deformation of the target can not be suppressed. Therefore, uniform deposition can not be obtained even by high power sputtering, causing increase in a defect rate and decrease in production efficiency.

In addition, the maximum value of displacement for the case of prolonged Sputtering OFF was 0.3491 mm. This is shown in Table 1 just for reference.

Thereafter (after sputtering), water cooling was stopped and a water pressure was removed. The maximum value of displacement from the flat was 0.04566 mm at the time. And, the maximum value of displacement from the flat state was −0.04628 mm when the fixation screws for the target were removed (a negative value means reversed bending; i.e., a phenomenon of slightly denting at the center).

A temperature when Sputtering OFF was 90.87° C., and a temperature when Sputtering ON was 406.4° C. Accordingly, the difference between the temperatures when Sputtering OFF and ON was 315.5° C.

Comparative Example 2

Next, Comparative Example 2 is described. For a test piece, high purity titanium of 4N5 (99.995 wt % except for gas components) was used as a target material (0.45 inches thick, 15.654 inches φ). For a backing plate, the above Cu—Cr alloy (0.5 inches thick, 15.654 inches φ) was used.

Then a 2 mm thick tantalum (Ta) plate (an insert) intervened at the bonded interface between the Ti target and the backing plate to give a test piece. The surfaces of the target and the backing plate were washed, and then enclosed within a vacuum vessel to perform HIP at 500° C. at a pressure of 1450 kg/cm² with a holding time of 1 hour.

After the target was bonded to the backing plate via the Ta plate (a Ta insert material) placed at the interface, ultrasonic inspection was performed from the target side to inspect an internal defect. In this ultrasonic inspection, no defects were observed at all at the interface between the target and the backing plate.

Next, one sample at the central region, two samples at the ½ R region, and two samples at the peripheral region were taken from this sputtering target-backing plate assembly to make tensile test pieces. Tensile tests were performed using these samples.

The results from the tensile tests showed that the adhesive strength was in the range between 7 and 10 kg/mm², indicating that the adhesive strength was poor. For all the regions sampled, the bonding strength of 3 kgf/mm² or more, which is a suitable condition for the present invention, was achieved.

Next, the sputtering target-backing plate assembly of Comparative Example was placed in a sputtering device to perform various measurements as in Example 1.

The results from the measurements are shown in Table 1. This sputtering target-backing plate assembly was placed in a sputtering device (the periphery of the backing plate was fixed), and cooling water was flowed on the rear of the backing plate while applying water pressure.

Then, at 38 kWh, sputtering was performed for 33 seconds (Sputtering ON), and then sputtering was stopped for 74 seconds (Sputtering OFF). Then this procedure was repeated 15 times, during which cooling was continued. After the procedure was repeated 15 times, the bulge at the central region (the amount of displacement) of the sputtering target-backing plate assembly became constant.

Note that the amount of displacement in this case corresponds to an amount of displacement from the state when the sputtering target-backing plate assembly was just mounted in the sputtering device; i.e. from the flat state.

The maximum value of displacement from the flat state when Sputtering OFF was 0.8946 mm. On the other hand, the maximum value of displacement from the flat state when Sputtering ON was 2.571 mm. Each of these is a mean value measured by repeating ON and OFF for 15 times as described above. Accordingly, the difference between these maximum values was 1.6764 mm, indicating that the difference was increased by 5 to 6 times compared with those in Examples.

The amount of deformation during sputtering in Comparative Example 2 is slightly smaller compared with that in Example 1. This appears to be because the sputtering target and the backing plate are strongly bonded by diffusion bonding.

However, a large difference in an amount of displacement between sputtering OFF and ON is not preferred. This is because a large difference between the maximum values due to repeating ON and OFF means that strain at the interface between the target and the backing plate during sputtering can not be absorbed and deformation of the target can not be suppressed. Therefore, uniform deposition can not be obtained even by high power sputtering, causing increase in a defect rate and decrease in production efficiency.

In addition, the maximum value of displacement for the case of prolonged Sputtering OFF was 0.2982 mm. This is shown in Table 1 just for reference.

Thereafter (after sputtering), water cooling was stopped and a water pressure was removed. The maximum value of displacement from the flat was 0.04161 mm at the time. And, the maximum value of displacement from the flat state was −0.04584 mm when the fixation screws for the target were removed (a negative value means reversed bending; i.e., a phenomenon of slightly denting at the center).

A temperature when Sputtering OFF was 90.99° C., and a temperature when Sputtering ON was 406.7° C. Accordingly, the difference between the temperatures when Sputtering OFF and ON was 315.7° C.

As apparent from Examples and Comparative Examples described above, when titanium was used as a target material and a Cu—Cr alloy was used as a backing plate, the presence of a 2 mm thick aluminum (Al) plate, nickel (Ni) plate or silver (Ag) plate as an insert material at the bonded interface between the Ti target and the backing plate allowed the difference between the maximum value of displacement from the flat when Sputtering ON and the maximum value of displacement from the flat when Sputtering OFF to be 1 mm or less.

Despite the unusual materials, Ti and a Cu—Cr alloy, are used for a target material and a backing plate, respectively, as described above, strain at the interface between the target and the backing plate during sputtering can be absorbed to suppress deformation of the target. This provides significantly advantageous effects; uniform deposition is possible even by high power sputtering to reduce a defect rate and to increase production efficiency.

The sputtering target-backing plate assembly of the present invention, in which a target material of Ti is bonded to a backing plate of a Cu—Cr alloy via a layer of Ni, Zn, Ag, Cu, Al, Cr, Sn, or an alloy primarily containing thereof placed at the interface, can absorb strain at the interface between the target and the backing plate during sputtering to suppress deformation of the target despite that unusual material, Ti, is used in the target. This provides significantly advantageous effects; uniform deposition can be possible even by high power sputtering to reduce a defect rate and to increase production efficiency. Further, no defects occur at the interface with a cupper alloy backing plate having high strength and high heat conductivity, and bonding strength is high. This provides significantly advantageous effects; sputtering can be possible even by high power sputtering, and production efficiency can increase.

The invention claimed is:

1. A sputtering target-backing plate assembly, wherein a Cu—Cr alloy backing plate having a content of Cr of 0.7 to 1.2 wt % is bonded to a Ti target via a layer of a strain absorbing material which is placed at an interface between the Ti target and the Cu—Cr alloy backing plate, the layer of the strain absorbing material being Al or an alloy containing Al as a primary component thereof and having a thickness of 1 to 6 mm and having a bond strength of 3 kg/mm2 or more.

2. The sputtering target-backing plate assembly according to claim 1, wherein a difference between a maximum value of displacement from a flat when turning sputtering ON and a maximum value of displacement from a flat when turning sputtering OFF is 1 mm or less.

3. The sputtering target-backing plate assembly according to claim 2, wherein a surface of the Cu—Cr alloy backing plate is roughened with a lathe in advance before bonding.

4. The sputtering target-backing plate assembly according to claim 3, wherein the Ti target is a high-purity Ti having a purity of 4N5 or higher.

5. The sputtering target-backing plate assembly according to claim 1, wherein a surface of the Cu—Cr alloy backing plate is roughened with a lathe before bonded to the Ti target.

6. The sputtering target-backing plate assembly according to claim 1, wherein the Ti target is a high-purity Ti having a purity of 4N5 or more.

7. The sputtering target-backing plate assembly according to claim 1, wherein the Cu—Cr alloy backing plate is diffusion-bonded to the Ti target via the layer of the strain absorbing material.

8. A method for producing a sputtering target-backing plate assembly in which a Ti target is bonded to a Cu—Cr alloy backing plate having a content of Cr of 0.7 to 1.2 wt %, the method comprising the steps of: placing a layer of Al or an alloy primarily containing Al, which has a thickness of 1 mm or more and 6 mm or less, at the interface between the target material and the backing plate; and performing bonding at a temperature between 400 and 550° C. under a pressure of 1450 kg/cm$^2$ to obtain a sputtering target-backing plate assembly having a bonding strength of 3 kg/mm$^2$ or more.

9. The method according to claim 8, wherein said bonding step is a diffusion-bonding step.

* * * * *